United States Patent
Wright

(10) Patent No.: US 6,181,033 B1
(45) Date of Patent: Jan. 30, 2001

(54) PRINTED CIRCUIT ASSEMBLY FOR A DYNAMOELECTRIC MACHINE

(75) Inventor: Kamron M. Wright, Fort Wayne, IN (US)

(73) Assignee: General Electric Company, Schenectady, NY (US)

(*) Notice: Under 35 U.S.C. 154(b), the term of this patent shall be extended for 0 days.

(21) Appl. No.: 09/467,525

(22) Filed: Dec. 21, 1999

Related U.S. Application Data

(62) Division of application No. 08/988,153, filed on Dec. 10, 1997, now Pat. No. 6,020,660.

(51) Int. Cl.[7] .................................................. H02K 54/00
(52) U.S. Cl. .......................... 310/DIG. 6; 310/67 R; 310/68 R; 310/71; 310/40 MM
(58) Field of Search ...................... 29/598, 827; 361/748, 361/784; 310/40 MM, DIG. 6

(56) References Cited

U.S. PATENT DOCUMENTS

| | | | |
|---|---|---|---|
| 4,742,183 | * 5/1988 | Soloway et al. | 174/68.5 |
| 4,755,699 | 7/1988 | Schmider | 310/68 R |
| 4,992,688 | 2/1991 | Cap et al. | 310/71 |
| 4,998,865 | 3/1991 | Nakanishi et al. | 417/423.7 |
| 5,321,585 | * 6/1994 | Trittschuh, III et al. | 361/784 |
| 5,369,322 | 11/1994 | Maruyama et al. | 310/39 |
| 5,493,161 | 2/1996 | Uno et al. | 310/156 |
| 5,754,411 | * 5/1998 | Woychik | 361/803 |
| 5,796,592 | * 8/1998 | Tanaka | 361/784 |
| 5,798,589 | 8/1998 | Ohi et al. | 310/90 |
| 5,825,628 | * 10/1998 | Garbelli et al. | 361/763 |
| 5,831,358 | 11/1998 | Bobay | 310/58 |
| 5,877,574 | 3/1999 | Molnar | 310/215 |

OTHER PUBLICATIONS

GE SME44 Motor Assembly, admitted prior art (no date).

* cited by examiner

*Primary Examiner*—Elvin Enad
(74) *Attorney, Agent, or Firm*—Senniger, Powers, Leavitt & Roedel; Damian Wasserbauer

(57) ABSTRACT

A dynamoelectric machine includes a stator having a stator core. A winding is provided on the stator core and the stator core has a stator bore. A rotor including a rotor core is received in the stator bore. A permanent magnet is mounted on the rotor core periphery and a rotor shaft is mounted on the rotor core. Bearing means are provided for supporting the rotor shaft for rotation relative to the stator. A first circuit board having electrical components thereon is used in operating the dynamoelectric machine, and a second circuit board having an electrical component in the form of a sensing device thereon is used in determining the position of the rotor. The first circuit board is constructed for mounting the second circuit board thereon so that the second circuit board projects axially inwardly from the first circuit board and the sensing device is disposed in an axial position overlapping the axial position of the permanent magnet.

10 Claims, 3 Drawing Sheets

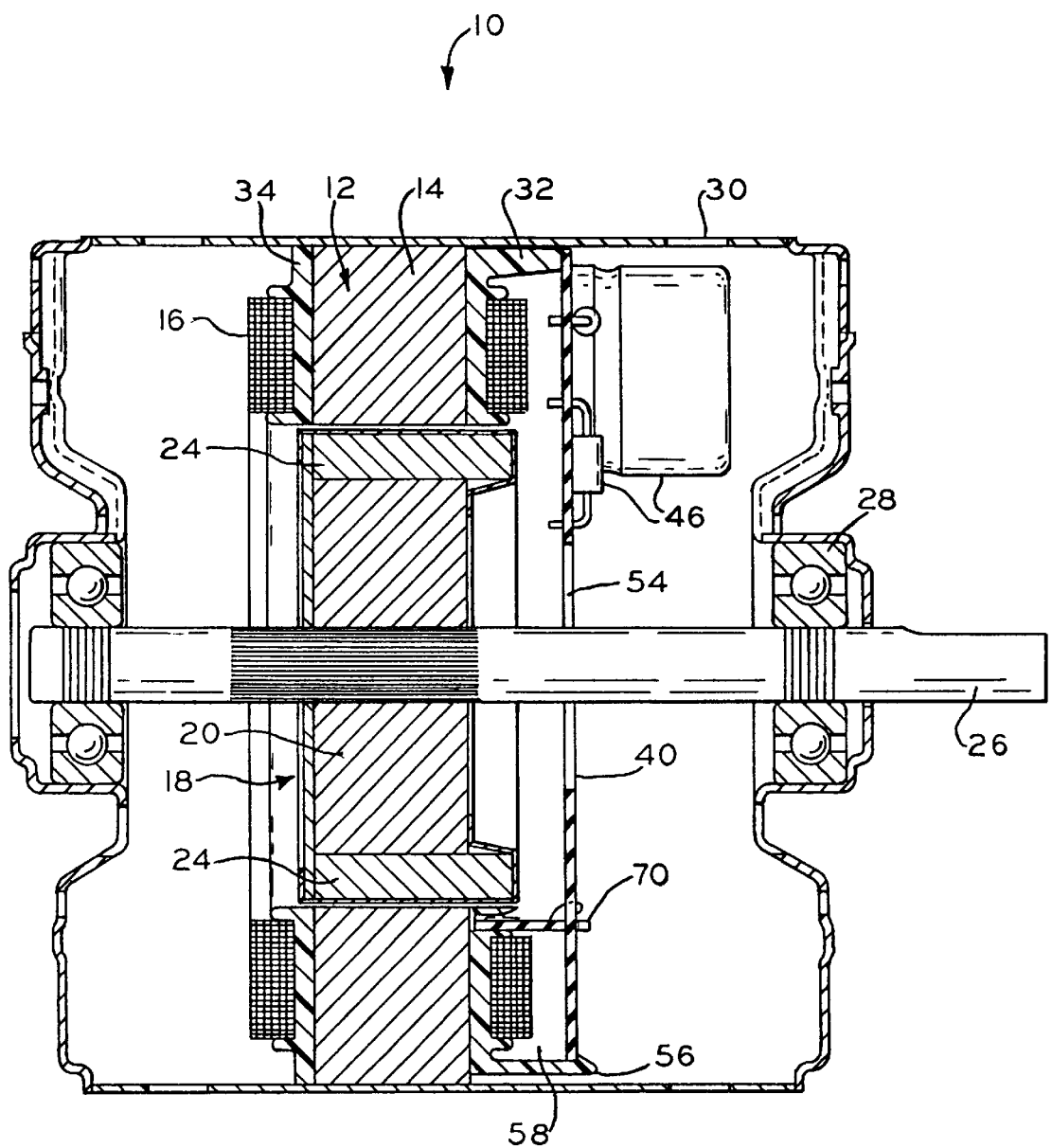
FIG_1

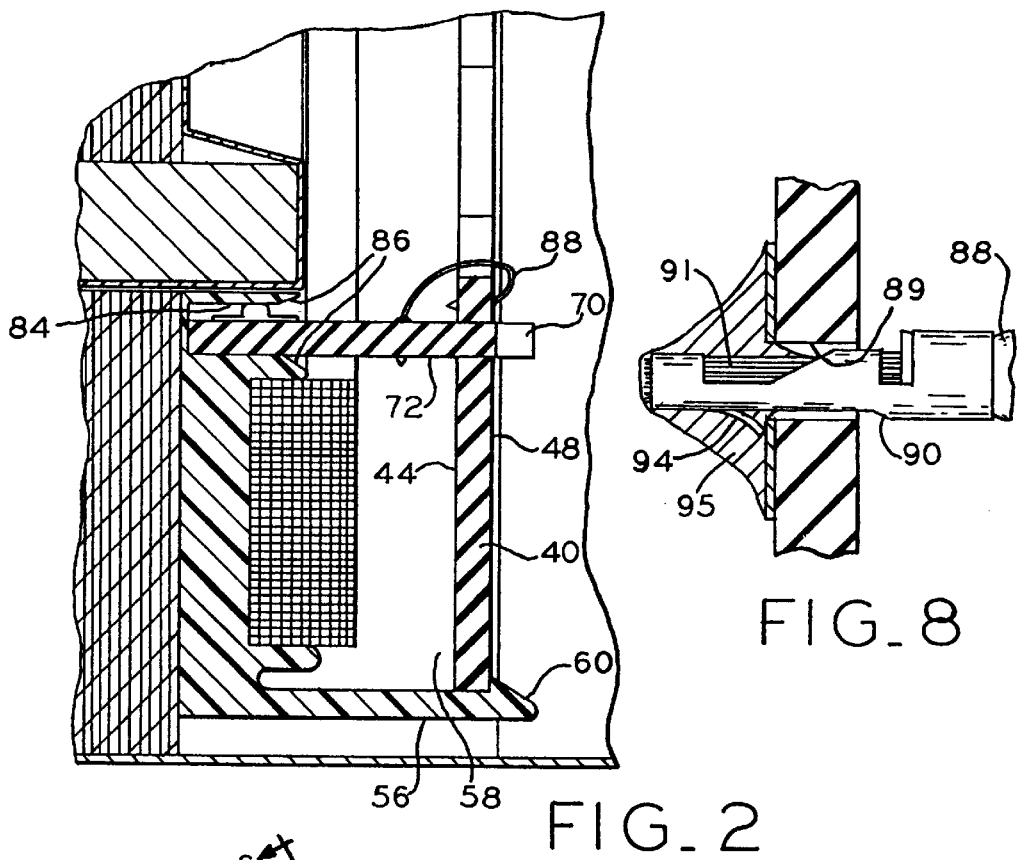
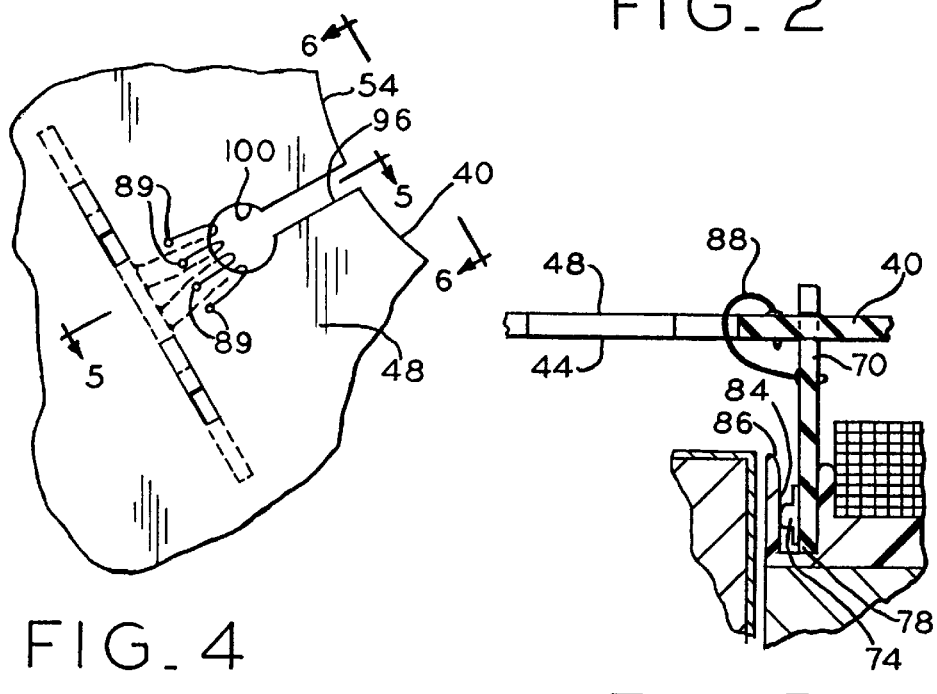

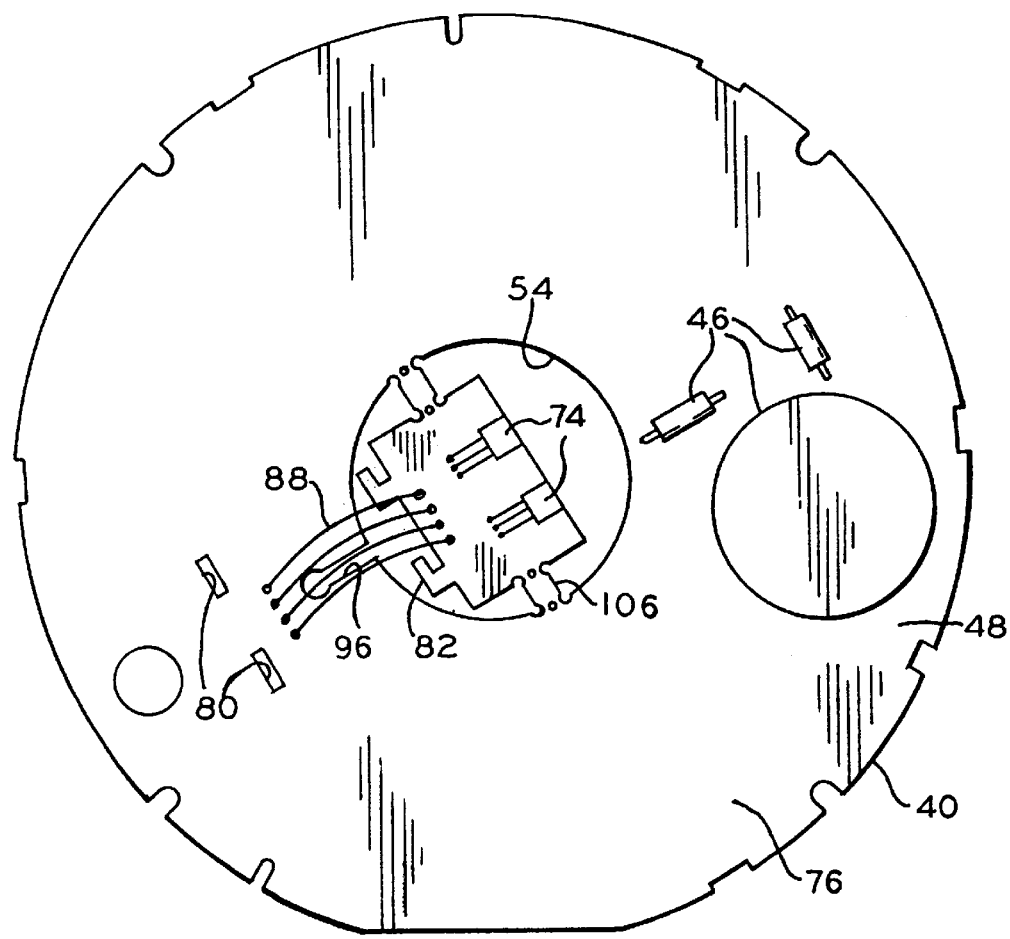
FIG_3
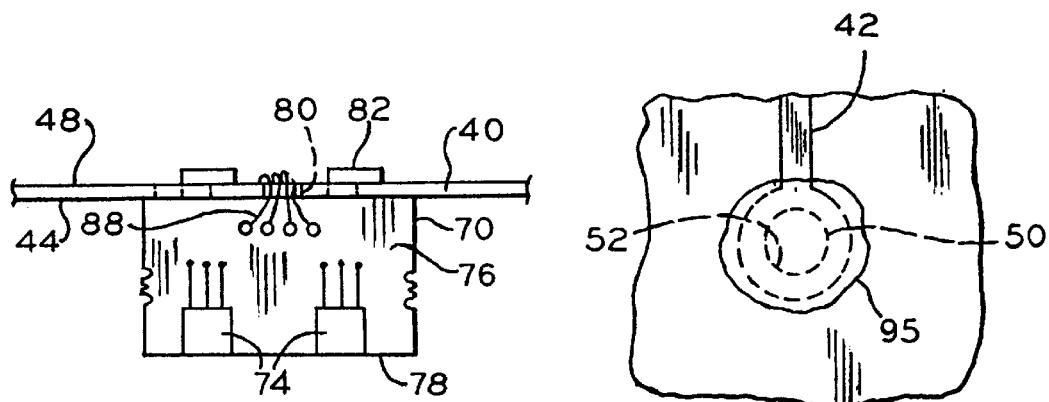
FIG_6
FIG_7

PRINTED CIRCUIT ASSEMBLY FOR A DYNAMOELECTRIC MACHINE

CROSS-REFERENCE TO RELATED APPLICATION

This application is a Divisional of U.S. application Ser. No. 08/988,153, filed Dec. 10, 1997, now U.S. Pat. No. 6,020,660, the entire disclosure of which is incorporated herein by reference.

BACKGROUND OF THE INVENTION

This invention relates generally to dynamoelectric machines and more particularly to an electronically commutated electric motor having a printed circuit board assembly with position sensing devices and other components for controlling the motor and a method of manufacturing a printed circuit board assembly.

Dynamoelectric machines, in the form of electric motors, have numerous applications, such as for washing machines, compressors, and fans, to name only a few. An important part of the utility of the motor is that it can be manufactured inexpensively and yet provide a reliable, long lasting, quiet, low maintenance motor for an appliance or other machine. Thus, there is a need for a motor which can be easily and rapidly assembled without sacrificing quality and reliability. One source of delay and cost in the manufacturing process is the electrical connections that must be made in the motor. Electronically commutated motors have sensors, such as Hall devices, for detecting the position of the rotor. The sensors are electrically connected to one or more circuit boards which mount control and power components for energizing the windings. The components are mounted on the side of the circuit board facing away from the rotor. However, in some instances components may also be mounted on the side of the circuit board facing toward the rotor. The sensors must be positioned near the magnets of the rotor and thus cannot be mounted on the component side of the circuit boards. Typically, the control and power components are mounted on the circuit board, and then the components are soldered to the boards. In a second manufacturing step, the sensors are mechanically attached on the side opposite and then soldered to the circuit boards.

SUMMARY OF THE INVENTION

Thus, there is a need for a circuit board assembly that is more easily manufactured.

Generally, a dynamoelectric machine of the present invention has a stator having a stator core and winding on the stator core. A rotor including a rotor core is received in a stator bore of the stator core. A permanent magnet is mounted on the rotor core periphery and a rotor shaft is mounted on the rotor core. Bearing means are provided for supporting the rotor shaft for rotation relative to the stator. A first circuit board having electrical components thereon is used in operating the dynamoelectric machine, and a second circuit board having an electrical component in the form of a sensing device thereon is used in determining the position of the rotor. The first circuit board is constructed for mounting the second circuit board thereon so that the second circuit board projects axially inwardly from the first circuit board and the sensing device is disposed in an axial position overlapping the axial position of the permanent magnet.

In another aspect of the present invention, a circuit board assembly generally has a unitary circuit board blank having a first circuit board and a second circuit board formed therein. Printed wiring is disposed on a first side of the first and second circuit boards and electrical components are disposed on a second side of the first and second circuit boards. The electrical components are connected to the printed wiring on the first side of the first and second printed circuit boards, and wiring is connected to the printed wiring on the first circuit board and extends from the first circuit board to the second circuit board on the second side of the first and second circuit boards. The second circuit board is attached by a frangible portion of the circuit board blank to the first circuit board whereby the second circuit board may be selectively removed from the first circuit board while maintaining electrical connection through the wiring.

In another aspect of the present invention, a method of manufacturing a circuit board assembly generally comprises the steps of forming first and second circuit boards from a unitary circuit board blank interconnected by a frangible portion of the circuit board blank. The circuit board blank has printed wiring on a first side thereof, but could also have printed wiring on a second side opposite the first side. Electrical components are mounted on a second side of the unitary circuit board blank on the first circuit board and the second circuit board. The electrical components have leads extending through the first and second circuit boards to the first side thereof. The electrical components are wave soldered to the printed wiring on the first side of the first and second circuit boards.

Other objects and features of the present invention will be in part apparent and in part pointed out hereinafter.

BRIEF DESCRIPTION OF THE DRAWINGS

FIG. 1 is a longitudinal section of an electric motor illustrating a first circuit board with a second circuit board mounted thereon;

FIG. 2 is an enlarged fragmentary longitudinal section of the electric motor of FIG. 1;

FIG. 3 is a plan view of the first and second circuit boards connected for a soldering process;

FIG. 4 is an enlarged, fragmentary plan view of the first circuit board having the second circuit board integrally mounted thereon and wires connecting the circuit boards;

FIG. 5 is an enlarged, fragmentary section view taken along line 5—5 in FIG. 4, illustrating a slot in the first circuit board in which wires between the two circuit boards are provided;

FIG. 6 is a view taken from the vantage indicated by line 6—6 in FIG. 4, and illustrating the attachment of the second circuit board to the first circuit board;

FIG. 7 is a fragmentary bottom view of the first circuit board showing a lead soldered to printed wiring on the circuit board; and FIG. 8 is a fragmentary section view illustrating a wire terminal soldered to the first circuit board;

Corresponding reference characters indicate corresponding parts throughout the several views of the drawings.

DETAILED DESCRIPTION OF THE PREFERRED EMBODIMENT

Referring now to the drawings, and in particular to FIGS. 1 and 2, a dynamoelectric machine in the form of an electric motor is indicated generally at 10. The motor includes a stator, indicated generally at 12, including a stator core 14 formed from a stack of laminations made of a highly magnetically permeable material, and windings 16 of magnet wire wound on the stator core in the way known to those of ordinary skill in the art. A rotor generally indicated at 18 includes a rotor core 20 formed from a stack of laminations made of a highly magnetically permeable material substantially received in a central bore of the stator core 14. The rotor 18 and the stator 12 are illustrated as being solid in FIG. 1 for simplicity, their construction being well known to those of ordinary skill in the art.

In the embodiment described herein, the motor 10 is a single phase, electronically commutated permanent magnet motor. It is to be understood, however, that aspects of the present invention may be applied to any electronically controllable motor or dynamoelectric machine typically powered by an electronic control circuit. Such motors include, for example, external rotor motors (i.e., inside out motors), permanent magnet motors, single and variable speed motors, selectable speed motors having a plurality of speeds, brushless dc motors, electronically commutated motors, switched reluctance motors and induction motors. In addition, the motors may be multi-phase or single phase motors and, in any case, such motors may have a single split phase winding or a multi-phase winding. Such motors may also provide one or more finite, discrete rotor speeds selected by an electrical switch or other control circuit.

The rotor 18 further includes permanent magnets 24 spaced angularly about the circumference of the rotor core 20 and a rotor shaft 26 mounted on the rotor core. The rotor shaft 26 is supported at opposite ends in roller bearings 28 mounted on a motor housing 30 for rotation of the rotor 18 relative to the stator 12 and the housing. In addition, annular stator right and left end caps (designated at 32 and 34, respectively) are mounted on respective axial ends of the stator core 14.

A first circuit board 40 has printed wiring 42 (FIG. 7) on a first side 44 and mounts electrical components 46 (FIGS. 1 and 3) on a second side 48 that are electrically connected to the printed wiring for use in operating the motor 10. The electrical components 46 of the first circuit board are preferably selected and configured for controlling operation of the motor 10, including commutation of the windings 16. Leads 50 (only one is shown) from the electrical components 46 extend through holes 52 in the first circuit board 40 to the first side 44 of the first circuit board and are soldered to the printed wiring 42 (FIG. 7). The printed wiring and electrical components 46 are shown and described only generally, because their general construction and operation is well understood by those of ordinary skill in the art.

The first circuit board 40 has a generally annular shape and a generally annular central opening 54 receiving the rotor shaft 26 therethrough. The first circuit board 40 is mounted with the first side 44 facing toward the stator 12 and rotor 18 and the second side, on which the electrical components 46 are mounted, facing away from the stator 12 and rotor 18. The first circuit board 40 is mounted on the motor by the right end cap 32, such as in the manner disclosed in co-assigned U.S. patent application Ser. No. 08/829,734, filed Mar. 31, 1997, which is incorporated herein by reference. More specifically, the right end cap 32 has five angularly spaced apart flexible fingers 56 (only one is shown) formed as one piece with the right end cap 32 and extending axially outwardly from the right end cap. The fingers 56 permit snap on connection of the first circuit board 40 to the right end cap 32. The first side 44 of the first circuit board 40 engages a shoulder 58 on the right end cap, and tips 60 of the fingers 56 engage the second side 48 of the first circuit board. However, the precise manner in which the first circuit board 40 is mounted on the motor 10 is not critical to the invention and other ways of attaching the first circuit board are within the scope of this invention.

A generally rectangular second circuit board 70 has printed wiring 42 on a first side 72 and mounts electrical components, more particularly, sensing devices in the form of Hall devices 74 on a second side 76 of the second circuit board at a distal edge margin 78. However, it is to be understood that the number of Hall devices used may be other than described without departing from the scope of the present invention. The printed wiring 42 and Hall devices 74 are shown only in simplified form, because their general construction and operation is well understood by those of ordinary skill in the art. Note that the Hall devices 74 are shown protruding from the second circuit board 70, but a recess could be formed in the second circuit board so that the Hall devices would not protrude.

Referring to FIGS. 4 and 6, the first circuit board 40 has rectangular-shaped slots 80 that interconnect with two L-shaped hangers 82 of the second circuit board 70 for mounting the second circuit board on the first circuit board 40. The hangers 82 of the second circuit board 70 are formed as one piece with the second circuit board and protrude from the second circuit board opposite the distal edge margin 78. As shown in FIGS. 2 and 5, the second circuit board 70 is disposed axially inwardly from the first side 44 of the first circuit board 40, with the second side 76 of the second circuit board facing the rotor shaft. Thus, the hangers 82 rest on the second side 48 of the first circuit board. The slots 80 are positioned radially outward relative to the magnets 24 of the rotor 18 so that when the second circuit board 70 is mounted, the Hall devices 74 are positioned in an axial position overlapping the axial position of the permanent magnets. The right end cap 32 has a receptacle 84 for receiving the distal edge margin 78 of the second circuit board 70. The receptacle 84 has a flared mouth 86 for use in guiding the second circuit board 70 into the receptacle during assembly. As received in the receptacle 84, the Hall devices 74 are precisely located for detecting the position of the rotor. The Hall devices 74 are capable of monitoring the magnetic field variations as the permanent magnets 24 turn with the rotor core 20, so as to sense a position of the rotor. The Hall devices 74 signal the rotor position to the electrical components 46 on the first printed circuit board 40 for use in commutating the windings 16 on the stator 12. The first circuit board 40 and second circuit board 70 and the right end cap 32 are arranged such that the right end cap electrically shields the first and second circuit boards.

Referring to FIGS. 4–6 and 8, four wires 88 extend from the second side 48 of the first circuit board 40 to the second side 76 of the second circuit board 70. As illustrated in FIG. 8, each end of each wire 88 has a terminal 90 engaged in a respective hole 89 in the circuit boards 40, 70. Each terminal 90 has material that is crimped over bare wire 91 and protrudes through the first side 44 of the respective circuit board and a spring portion 94 that locks the terminal into the hole. The terminals 90 are used to ensure the wires 88 are secure inside their respective holes 89, and to provide strain relief after the terminals are soldered. The holes 89 for the terminals 90 are positioned adjacent and radially inward from the slots 80 of the first circuit board 40 and axially outward from the Hall devices 74 of the second circuit board 70. The terminals 90 are electrically connected to the printed wiring 42 of the first circuit board 40 and the second circuit board 70 using solder 95. The first circuit board has a wire slot 96 extending radially outwardly from the central opening 54, the wire slot 96 having a circular portion 100 at its radially outer end adjacent the holes 89 of the first circuit board 40 that receive the four wires 88. The wire slot 96 receives the wires 88 through the first circuit board 40 generally in the circular portion 100, serving to minimize the length of wire required to connect the circuit boards and thus to keep the wires from interfering with the rotor 18 or rotor shaft 26.

Referring to FIG. 3, a preferred method of manufacturing the first circuit board 40 and the second circuit board 70 is hereinafter described. The first and second circuit boards are formed from a unitary circuit board blank having printed wiring 42 on a first side thereof. The circuit board blank may be made of conventional circuit board material. The central opening 54, the slots 80 and the wire slot 96 are formed in the first circuit board 40. The second circuit board 70 is formed within the central opening 54 of the first circuit board 40, and is connected to the first circuit board 40 by two narrow, rectangular frangible portions 106 of the circuit board blank. Thus, the second circuit board 70 is formed from the circuit board material that would otherwise be cut away and discarded to form the central opening 54. The second circuit board 70 is formed to have a generally rectangular shape and two integral hangers 82 protruding therefrom as described above. The frangible portions 106 narrow further where they connect to the circuit boards so that the connections at both circuit boards are capable of being severed by a pair of pliers or a shearing tool (not shown).

The electrical components 46 for operating the motor, including the Hall devices 74, are mounted on a second side of the circuit board blank on the first circuit board 40 and the second circuit board 70. The method of mounting the electrical components 46 and wires 88 is described only in simplified form, because their general assembly is well understood by those of ordinary skill in the art. Leads 50 from the electrical components 46 are inserted through holes 52 in the first circuit board 40 and the second circuit board 70 to the respective first sides 44, 72 of the circuit boards. The leads 50 are crimped to prevent the leads 50 from being withdrawn from the holes 52. The terminals 90 of the wires 88 are connected from the second circuit board 70 to the first circuit board 40 by inserting them in the holes 89 adjacent the slots 80 and the Hall devices 74, respectively (see FIG. 8). The terminals 90 engage the holes 89 to ensure the wires 88 are secure during soldering, and to provide strain relief after the terminals are soldered to their respective holes. The leads 50 of the electrical components 46 and Hall devices 74 and the wires 88 must then be soldered to the circuit boards 40, 70.

In the preferred embodiment, a conventional wave soldering operation is performed. During the operation, the first circuit board 40 and the second circuit board 70 are attached by the frangible portions 106 described above, so that the bottom surfaces of the circuit boards are coplanar, and the electrical components 46, including the Hall devices 74 are mounted on the top surfaces. Thus, a single soldering operation can be performed on both circuit boards while they are attached, and in the preferred embodiment, only a single pass through a wave soldering machine is necessary. All of the components 46, including the Hall device 74 are protected from the solder material because of their location on the top surface of the circuit boards 40, 70. The wave soldering operation is described only in simplified form because the general process is well understood by those of ordinary skill in the art. A wave soldering machine (not shown) includes a pump to create a wave within a container of molten solder, the molten solder being composed, for example, of a tin-lead alloy. The molten solder will bond with metal portions of the boards, and will bond most readily with similar metals. Therefore, the holes 52, 89 of the first and second circuit boards 40, 70 are preferably constructed with a covering composed of a tin-lead alloy and the leads 50 and the terminals 90 are composed of a tin-lead alloy or have a covering composed of a tin-lead alloy. The first and second circuit boards 40, 70 are placed in the machine, and the coplanar bottom surfaces of the circuit boards contact the wave of molten solder. The molten solder wicks into the holes 52, 89 and onto the leads 50 and terminals 90 positioned in the holes (see FIG. 7). The solder 95 thus forms an electrical connection between the holes 52, 89 and adjacent printed wiring 42 and their respective leads 50 and terminals 90.

After completion of the wave soldering process, the frangible portions 106 between the first circuit board 40 and the second circuit board 70 is broken. The second circuit board is swung downward from the first circuit board, the wires 88 being received within the wire slot 96 formed in the first circuit board. The second circuit board 70 is mounted on the first circuit board 40 by inserting the hangers 82 of the second circuit board into the slots 80 of the first circuit board and sliding the hangers over the first circuit board to form an interference fit. Thus, the second circuit board 70 now extends perpendicularly outwardly from the first circuit 40 and the Hall devices 74 are located below the components 46 on the first circuit board.

The first circuit board 40 is mounted on the motor 10 by pushing it axially inward against the tips 60 of the fingers 56. As the first circuit board 40 is pushed inward, the distal edge margin 78 of the second circuit board 70 is automatically guided into the receptacle 84 in the right end cap 32 by the flared mouth 86 of the receptacle 84 (FIG. 2). The wedge shape of the tips 60 permits the board to resiliently bend all of the fingers 56 simultaneously radially outwardly from their relaxed positions. The first circuit board 40 moves inwardly until it engages the shoulder 58 on the right end cap 32. At approximately the same moment the first circuit board 40 engages the shoulder 58, it clears the axially inner ends of the tips 60, allowing the fingers 56 to snap back toward their relaxed positions and bringing the tips over the outer surface of the first circuit board. Thus, the first circuit board 40 is held on the right end cap 32 between the shoulder 58 of the right end cap and the tips. As received in the receptacle 84, the Hall devices 74 are precisely located for detecting the position of the rotor 18.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A circuit board assembly comprising a unitary circuit board blank having a first circuit board and a second circuit board formed therein, printed wiring disposed on a first side of the first and second circuit boards and electrical components disposed on a second side of the first and second circuit boards, the electrical components being connected to the printed wiring on the first side of the first and second printed circuit boards, wiring connected to the printed wiring on the first circuit board and extending from the first circuit board to the second circuit board on the second side of the first and second circuit boards, the second circuit board being attached by a frangible portion of the circuit board blank to the first circuit board whereby the second circuit board may be selectively removed from the first circuit board while maintaining electrical connection through the wiring, and an integral connector element formed in the blank and formed as one-piece with the second circuit board, said connector element constructed for engagement with the first circuit board for mounting the second circuit board on the first circuit board.

2. A circuit board assembly as set forth in claim 1 wherein the connector element is constructed for mounting the second circuit board in a non-coplanar orientation with the first circuit board and so that the second circuit board is generally in fixed position relative to the first circuit board.

3. A circuit board assembly as set forth in claim 2 wherein the first circuit board further comprises at least one slot formed therein and the connector element comprises at least one L-shaped hanger sized and shaped for reception in the slot.

4. A circuit board assembly as set forth in claim 1 wherein the first circuit board has a central opening and a wire slot extending radially outwardly from the central opening and constructed for receiving the wiring through the first circuit board generally at a radially outer end of the wire slot when the second circuit board is mounted on the first circuit board by interconnection of the first and second connector elements.

5. A circuit board assembly as set forth in claim 4 wherein the electrical component mounted on the second circuit board is a Hall device.

6. A circuit board assembly as set forth in claim 5 wherein the second circuit board is disposed in the central opening of the first circuit board.

7. A circuit board assembly comprising a unitary circuit board blank having a first circuit board and a second circuit board formed therein, printed wiring disposed on a first side of the first and second circuit boards and electrical components disposed on a second side of the first and second circuit boards, the electrical components being connected to the printed wiring on the first side of the first and second printed circuit boards, wiring connected to the printed wiring on the first circuit board and extending from the first circuit board to the second circuit board on the second side of the first and second circuit boards, the second circuit board being attached by a frangible portion of the circuit board blank to the first circuit board whereby the second circuit board may be selectively removed from the first circuit board while maintaining electrical connection through the wiring, and said first circuit board further comprising a central opening and a wire slot extending radially outwardly from the central opening and constructed for receiving the wiring through the first circuit board generally at a radially outer end of the wire slot when the second circuit board is mounted on the first circuit board.

8. A circuit board assembly as set forth in claim 7 wherein the electrical component mounted on the second circuit board is a Hall device.

9. A circuit board assembly as set forth in claim 8 wherein the second circuit board is disposed in the central opening of the first circuit board.

10. A circuit board assembly as set forth in claim 7 wherein the second circuit board is disposed in a central opening of the first circuit board.

* * * * *